United States Patent

Lloyd

[15] 3,638,081

[45] Jan. 25, 1972

[54] INTEGRATED CIRCUIT HAVING LIGHTLY DOPED EXPITAXIAL COLLECTOR LAYER SURROUNDING BASE AND EMITTER ELEMENTS AND HEAVILY DOPED BURIED COLLECTOR LARGER IN CONTACT WITH THE BASE ELEMENT

[72] Inventor: Robert H. F. Lloyd, Sunnyvale, Calif.

[73] Assignee: International Business Machines Corporation, Armonk, N.Y.

[22] Filed: Aug. 13, 1968

[21] Appl. No.: 752,207

[52] U.S. Cl. ................317/235 R, 317/235 E, 317/235 AM, 317/235 D, 317/235 AD, 307/303

[51] Int. Cl. ........................................................H01l 19/00

[58] Field of Search..................................317/235; 307/303

[56] References Cited

UNITED STATES PATENTS

| | | | |
|---|---|---|---|
| 3,506,893 | 4/1970 | Dhaka | 317/235 |
| 3,473,093 | 10/1969 | Bilons et al. | 317/235 |
| 3,414,783 | 12/1968 | Moore | 317/235 |
| 3,341,755 | 9/1967 | Husher | 317/235 |
| 3,460,006 | 8/1969 | Strull | 317/235 |
| 3,449,643 | 6/1969 | Imaizumi | 317/235 |
| 3,453,504 | 7/1969 | Compton et al. | 317/235 |
| 3,423,650 | 1/1969 | Cohen | 317/234 |

*Primary Examiner*—John W. Huckert
*Assistant Examiner*—Martin H. Edlow
*Attorney*—Fraser and Bogucki

[57] ABSTRACT

An integrated circuit is provided in which a heavily doped buried layer within the collector of a transistor extends into contact with the base thereof to form the major portion of the collector-base junction. The buried layer enhances the current gain bandwidth by minimizing the width of the collector-base depletion region and the shift thereof into the collector for high-current densities. The effects of capacitances at the collector-base junction and at the junctions of resistors and isolating walls adjacent the transistor are minimized by a lightly doped epitaxial layer within the collector of the transistor.

7 Claims, 9 Drawing Figures

*INVENTOR*
ROBERT H. F. LLOYD
BY *Fraser and Bogucki*
*ATTORNEYS*

INVENTOR
ROBERT H. F. LLOYD
BY Fraser and Bogucki
ATTORNEYS

INVENTOR
ROBERT H. F. LLOYD
BY Fraser and Bogucki
ATTORNEYS

INVENTOR
ROBERT H. F. LLOYD
BY Fraser and Bogucki
ATTORNEYS

INTEGRATED CIRCUIT HAVING LIGHTLY DOPED EXPITAXIAL COLLECTOR LAYER SURROUNDING BASE AND EMITTER ELEMENTS AND HEAVILY DOPED BURIED COLLECTOR LARGER IN CONTACT WITH THE BASE ELEMENT

BACKGROUND OF THE INVENTION

1. Field of the Invention

The present invention relates to semiconductor devices, and more particularly to integrated circuits having one or a plurality of transistors and other circuit elements such as resistors included therein.

2. Description of the Prior Art

The increasing complexity of computer and other electronic systems coupled with a strong emphasis on miniaturization has dictated the use of circuit components or arrangements which occupy a limited amount of physical space within the system, yet perform the necessary electronic functions. One solution to the problem has been the use of integrated circuit techniques in which entire circuits can be fabricated from a single crystal of semiconductor material using diffusion or other well-known processes. The completed circuit provides an integral unit of considerable simplicity and relatively small size, which unit may be readily incorporated in a larger system and removed for maintenance or repair as required.

Coupled with the problem of continuing miniaturization to meet limited space requirements is the need for greater performance from circuit elements or components of given size. In a conventional transistor of limited size, for example, the current gain bandwidth typically decreases at high current densities due to the widening of the collector-base depletion region and the shifting thereof into the collector, thereby increasing the transit time of minority carriers through the base and depletion region. The displacement of the collector-base depletion region is directly related to the impurity doping level in the collector, and the allowable operating current density of the transistor can accordingly be increases by heavily doping the collector with impurities. Such action however results in a considerable sacrifice in other aspects of transistor performance. The presence of heavily doped material throughout the collector greatly increases the capacitance of the collector-base junction for practically all levels of current density. While high collector-base junction capacitance appears to be a necessary adjunct to high current performance within the transistor, such capacitance should desirably be greatly reduced when low current densities are present. Moreover, the presence of heavily doped material throughout the collector greatly increases the capacitive effects of junctions formed by the collector with external resistors adjacent the transistor and isolating elements which may encircle the transistor in order to electrically isolate it from other transistors or circuit elements contained within the same integrated circuit chip.

BRIEF SUMMARY OF THE INVENTION

Briefly, the present invention provides an integrated circuit in which the current gain bandwidth of one of more transistors contained therein is preserved at high current densities without sacrifice in the capacitive effects of the collector-base junction and of the junctions which may be formed by the collector region with resistors external to the transistor and with an isolating region. The collector of the transistor includes a buried layer of relatively heavily doped material which extends into contact with the base to form the major portion of the collector-base junction. The buried layer provides a large concentration of ionized impurity atoms to minority carriers diffusing through the base, and the resulting increase in the electrical base width at high current densities is accordingly minimized. The width of the collector-base depletion region is also minimized, and may actually decrease with increasing current densities depending on transistor construction.

The buried layer extends beyond the base of the transistor and into contact with at least one heavily doped collector plug communicating with a collector contact at the surface of the chip to provide a collector current path of high conductivity. The remaining portions of the collector which extend outwardly from the emitter and base regions and into contact with any resistors or isolation regions which may reside within the same island as the transistor comprise relatively lightly doped material. The presence of the lightly doped material at junctions formed with the resistors and isolation regions as well as those portions of the base not in contact with the buried layer greatly reduces the capacitive effects of such junctions.

BRIEF DESCRIPTION OF THE DRAWINGS

The foregoing and other objects, features and advantages will be apparent from the following more particular description of the preferred embodiments of the invention, as illustrated with the accompanying drawings.

DETAILED DESCRIPTION

Figure 1:
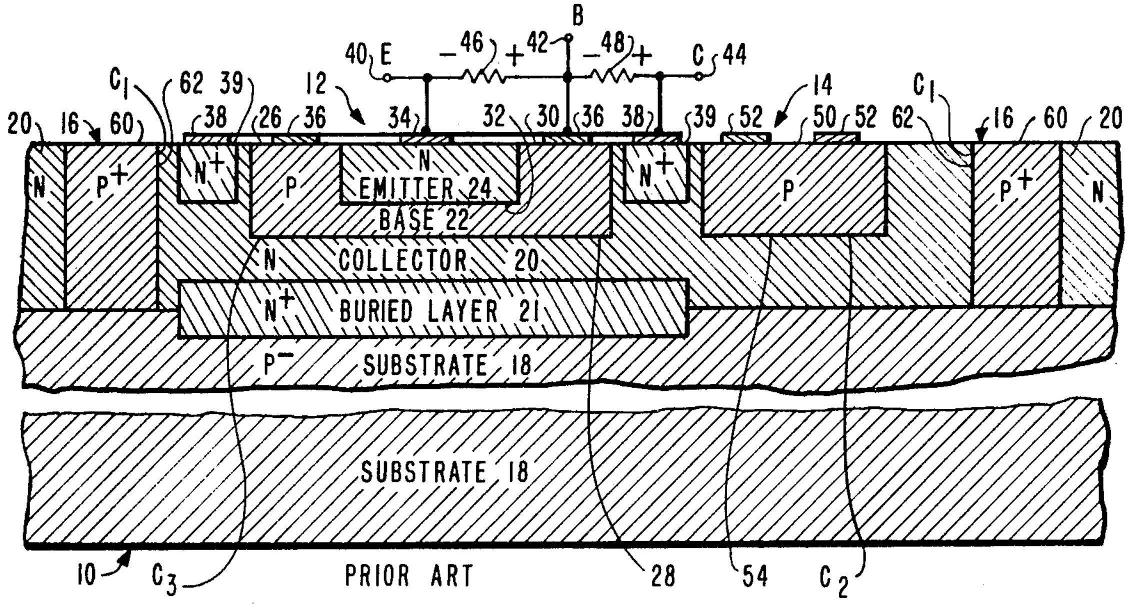
FIG. 1 is a sectional view of a conventional integrated circuit having a transistor, a resistor and an isolation region.

FIG. 1 illustrates a conventional integrated circuit 10 which includes a transistor 12, a resistor 14 external to but adjacent the transistor 12 and an isolation region 16 surrounding the transistor 12 and resistor 14. The transistor 12 is illustrated and hereafter described as being of the NPN-type of semiconductivity for purposes of illustration only. The integrated circuit 10 includes a substrate element or region 18 of relatively lightly doped material of P-type semiconductivity over which a relatively thin layer of material of N-type semiconductivity is disposed by an appropriate process such as epitaxial growth to form a collector element or region 20. The relative thickness of the collector 20 is greatly exaggerated in FIG. 1 for purposes of clarity. A subcollector element or region in the form of a buried layer 21 of relatively heavily doped material of N-type semiconductivity is disposed between and partially inset within the epitaxial layer 20 and substrate region 18. The transistor 12 is completed by base and emitter elements or regions 22 and 24 of P- and N-type semiconductivity material respectively, the base 22 being inset into the collector 20 from an upper surface 26 thereof to form a collector-base junction 28 with the collector 20, and the emitter 24 being inset into the base 22 from an upper surface 30 thereof to form an emitter-base junction 32 with the base 22. The base and emitter regions 22 and 24 are formed by an appropriate process such as diffusion. The transistor 12 is completed by an ohmic emitter contact 34 formed with the emitter 24, an ohmic base contact 36 formed with the base 22, and an ohmic collector contact 38 formed with the collector 20. A pair of regions 39 of relatively heavily doped material of N-type semiconducivity are inset into the epitaxial layer 20 from the upper surface thereof to facilitate the formation of the collector contacts 38. The regions 39 are typically formed by the same diffusion which is used to form the emitter element 24. The emitter, base and collector contacts 24, 36 and 38 are respectively coupled to emitter, base and collector terminals 40, 42 and 44 so that the transistor 12 may be used as desired. The base and collector contacts 36 and 38 are each illustrated as comprising a pair of contacts which may be coupled to one another by appropriate means such as shorting straps (not shown.) Appropriate biasing of the transistor 12 for operation is illustrated by way of example as being provided by a pair of resistors 46 and 48 respectively coupled between the emitter and base terminals 40, 42 and the base and collector terminals 42, 44 to forward bias the emitter-base junction 32 and reverse bias the collector-base junction 28 in appropriate conventional fashion.

Depending upon the application of the integrated circuit 10, such circuit may require other electrical components or elements in addition to the transistor 12. The circuit 10 of FIG. 1 is illustrated as having a resistor 14 external to but within the same island as the transistor 12. The resistor 14 comprises an element or region 50 of P-type semiconductivity material inset into the collector 20 from the upper surface 26 thereof at a location spaced apart from the transistor 12. A pair of ohmic resistor contacts 52 are formed with the region 50 to provide for the external connection of the resistor 14 as desired.

If the integrated circuit 10 is to include further electrical components or elements such as additional ones of the transistor 12, it is desirable to isolate the transistor 12 and resistor 14. Isolation may be accomplished in a number of different ways, one of the most common ones comprising a reverse-biased PN-junction which surrounds the elements to be isolated so as to form a distinct island within the integrated circuit chip. In the present example isolation of the transistor 12 and resistor 14 is provided by surrounding isolation regions 16 which include elements or regions 60 of relatively heavily doped material of P-type semiconductivity inset into the collector 20 from the upper surface thereof and extending into contact with the substrate 18. The resulting PN-junctions 62 formed by the isolation regions 60 and the collector 20 define isolation walls for the transistor 12 and resistor 14 since they prevent leakage currents from other integrated circuit elements from interferring with the operation of the transistor 12 and resistor 14, and vice versa. The PN-junction formed by the substrate 18 and the collector 20 may also be reverse-biased to isolate the transistor 12 and resistor 14.

Figure 2:
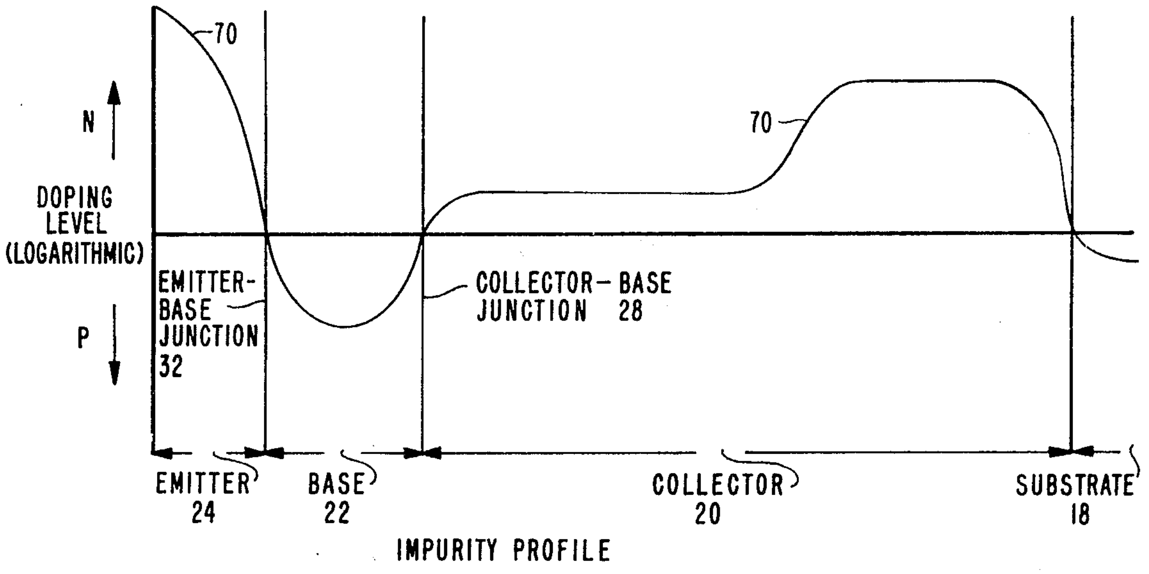
FIG. 2 is an impurity profile of the transistor of the FIG. 1 arrangement.

A typical impurity profile of the transistor 12 which is a logarithmic plot of the doping level of the emitter, base, collector and substrate as a function of position along vertical axes extending downwardly through such regions is illustrated in FIG. 2. The extreme left-hand portion of FIG. 2 corresponds to the upper surface of the emitter 24 while the extreme right-hand portion thereof corresponds to a position within the substrate 18. The profile of FIG. 2 as shown by the curve 70 has relatively gradual transitions which assume that the emitter and base 24 and 22 are formed by diffusion. The doping level of the N-type material comprising the emitter 24 decreases to zero as the emitter-base junction 32 is reached. The doping or impurity level of the P-type material comprising the base 22 increases from zero value at the emitter-base junction 32 to a maximum value, then decreases to zero as the collector-base junction 28 is reached. The epitaxial layer forming the collector region 20 results in a slight rise of the doping level in the N direction, the level rising even further in the N direction as the more heavily doped buried layer 21 is encountered then dropping to a small value in the P direction as the substrate 18 is entered. Because of the nature of the fabrication process, the gradient of collector region doping in the vicinity of the collector-base junction 28 is less than the gradient of base region doping in the vicinity of the junction.

It is well known that whenever materials of P- and N-type semiconductivity are disposed in junction forming relation, holes from the P-type material and electrons from the N-type material travel away from the junction into other regions where they combine with ions. Positive and negative net charges exist adjacent the junction and a static electric field extends across the junction between the opposite boundaries of a resulting region of charge equilibrium or depletion region. Depletion regions exist at the emitter-base and collector-base junctions of a transistor.

Figures 3, 4:
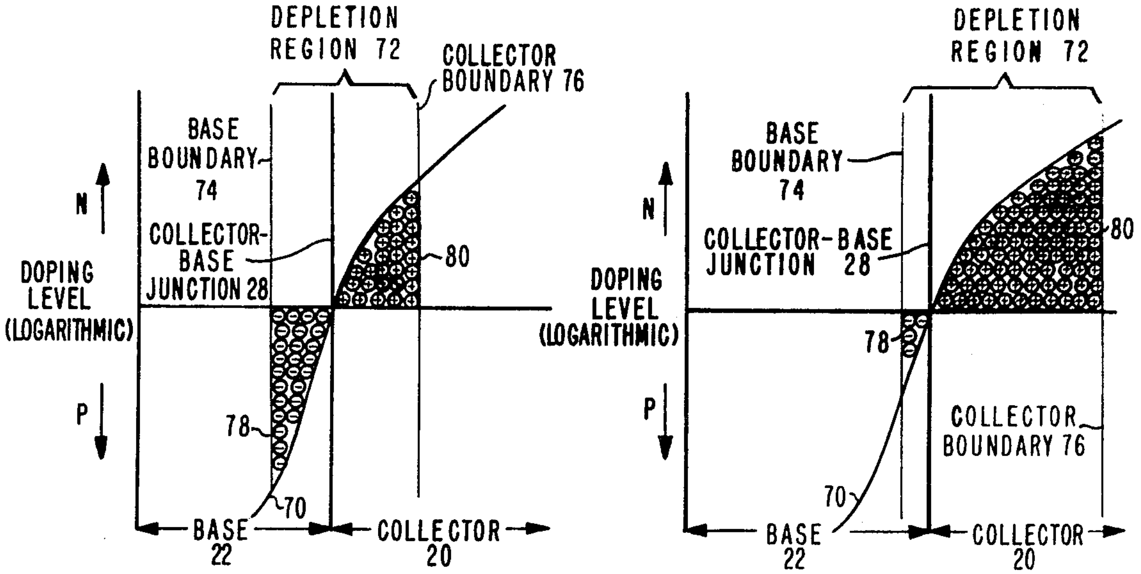
FIG. 3 is an enlarged showing of a portion of the impurity profile of FIG. 2 illustrating the nature of the collector-base depletion region for little or no flow of current.
FIG. 4 is an enlarged showing of a portion of the impurity profile of FIG. 2 illustrating the nature of the collector-base depletion region for relatively high current densities.

FIG. 3 illustrates the nature of the collector-base junction depletion region 72 of the transistor 12 when little or no current flow is present. The opposite boundaries of the depletion region 72 within the base and collector 22 and 20 are respectively termed the base and collector boundaries 74 and 76. The base and collector portions of the depletion region 72 which respectively extend between the base and collector boundaries 74, 76 and the collector-base junction 28 provide negative and positive impurity ions 78 and 80 which are conveniently illustrated as encircled minus and plus signs. The locations of the base and collector boundaries 74 and 76 are respectively determined by the number of negative and positive ions 78 and 80 required to establish charge equilibrium. With no current flowing through the transistor 12, approximately equal numbers of the negative and positive ions 78 and 80 are required to establish the depletion region 72. As shown in FIG. 3 the collector boundary 76 is spaced a greater distance from the collector-base junction 28 than is the base boundary 74 since the gradient of the impurity doping on the collector side of the junction 28 is less than that on the base side of the junction.

If the emitter-base and collector-base junctions 32 and 28 are respectively forward and reverse-biased a current flow is provided by electrons from the emitter 24 which diffuse through the base 22 as minority carriers to the collector 20. The presence of minority carriers in the base 22 and the depletion region 72 reduces the required number of negative ions 78 and increases the required number of positive ions 80 to maintain charge equilibrium. This results in a shifting of the depletion region 72, the base boundary 74 thereof being relocated closer to the collector-base junction 28 in order to provide fewer negative ions 78, and the collector boundary 76 being positioned further away from the collector-base junction 28 to provide a greater number of positive ions 80. The lower gradient of the impurity doping on the collector side of the collector-base junction 28 than on the base side thereof dictates a greater displacement of the collector boundary 76 resulting in an increase in the width of the depletion region 72.

Figure 5:
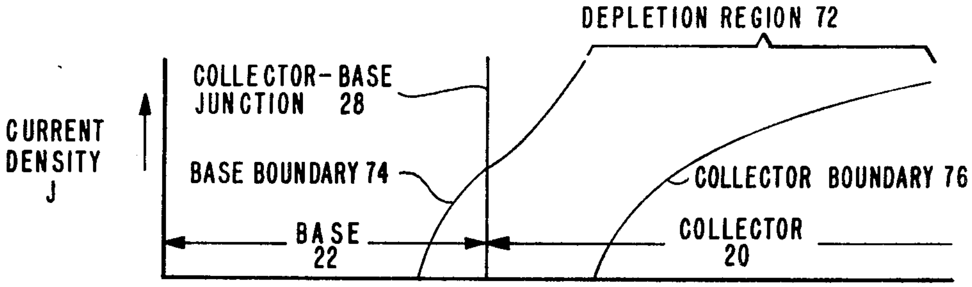
FIG. 5 is a diagrammatic plot of the collector-base depletion region boundaries of the transistor in the FIG. 1 arrangement as a function of current density.

FIG. 5 is a plot of the base and collector boundaries 74 and 76 and the resulting width of the depletion region 72 which extends therebetween as a function of current density J within the transistor 12. It will be noted that as J increases the base boundary 74 gradually moves across the collector-base junction 28 and into the collector 20. At the same time the collector boundary 76 moves away from the collector-base junction 28 at an ever increasing rate.

As the current density J is increased, more and more electrons from the emitter 24 must diffuse as minority carriers across the base 22 and the depletion region 72 to the collector 20. The transit time of such minority carriers is generally a direct function of the width of the depletion region 72 and a function of the square of the electrical base width or distance from the emitter-base junction 32 to the base boundary 74 of the depletion region 72. The practical result of the increase in minority carrier transit time for higher current densities J is a noticable reduction in the current gain bandwidth of the transistor. Thus, for relatively low values of J the minority carrier transit time is relatively short and the bandwidth is considerable, while at relatively high current densities the minority carrier transit time is relatively long and the bandwidth is accordingly reduced.

One technique commonly employed to improve the current gain bandwidth at high current densities takes advantage of the fact that the shifting of the depletion region 72 into the collector 20 for a given current density is substantially inversely proportional to the level of impurity doping within the collector 20. The entire collector region 20 of the transistor is heavily doped such as by omitting the buried layer 21 and fabricating the collector 20 of N+ rather than N material. The resulting presence of heavily doped material in the vicinity of the collector-base junction 28 provides a large concentration of the impurity ions 80, and the shift of the depletion region 72 at high current densities is minimized. Such improvement however, is at the expense of greatly increased capacitive effects throughout the integrated circuit 10. The presence of the heavily doped material in the vicinity of the isolating regions 60 greatly increases the effects of the sidewall capacitances illustrated as $C_1$ in FIG. 1. The practical result is a considerable decrease in the effectiveness of the resistive isolation provided by the regions 60. Moreover, the presence of heavily doped material at the resistor isolating junction 54 greatly increases the capacitance $C_2$ of such junction, resulting in deterioration in the performance of the resistor 14.

The value of capacitance $C_3$ at the collector-base junction 24 is a function of the impurity doping level of the collector 20 in the vicinity of such junction. Accordingly, a relatively large value of $C_3$ is one sacrifice which must be made in order to have a high current performance transistor. However, the value of $C_3$ should be as low as possible, and is desirably of low value when low current densities are present in the transistor. Such is not possible where the entire collector 20 is heavily doped, and the value of $C_3$ remains high for all levels of current density, including those which are relatively low.

Figure 7:
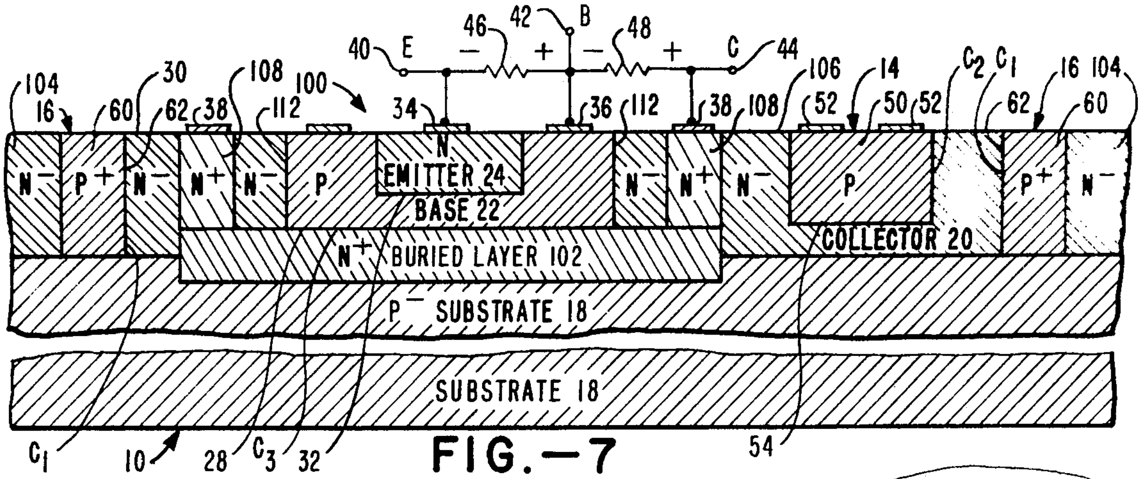
FIG. 7 is a sectional view of the integrated circuit of FIG. 6 taken along the line 7—7.
Figure 6:
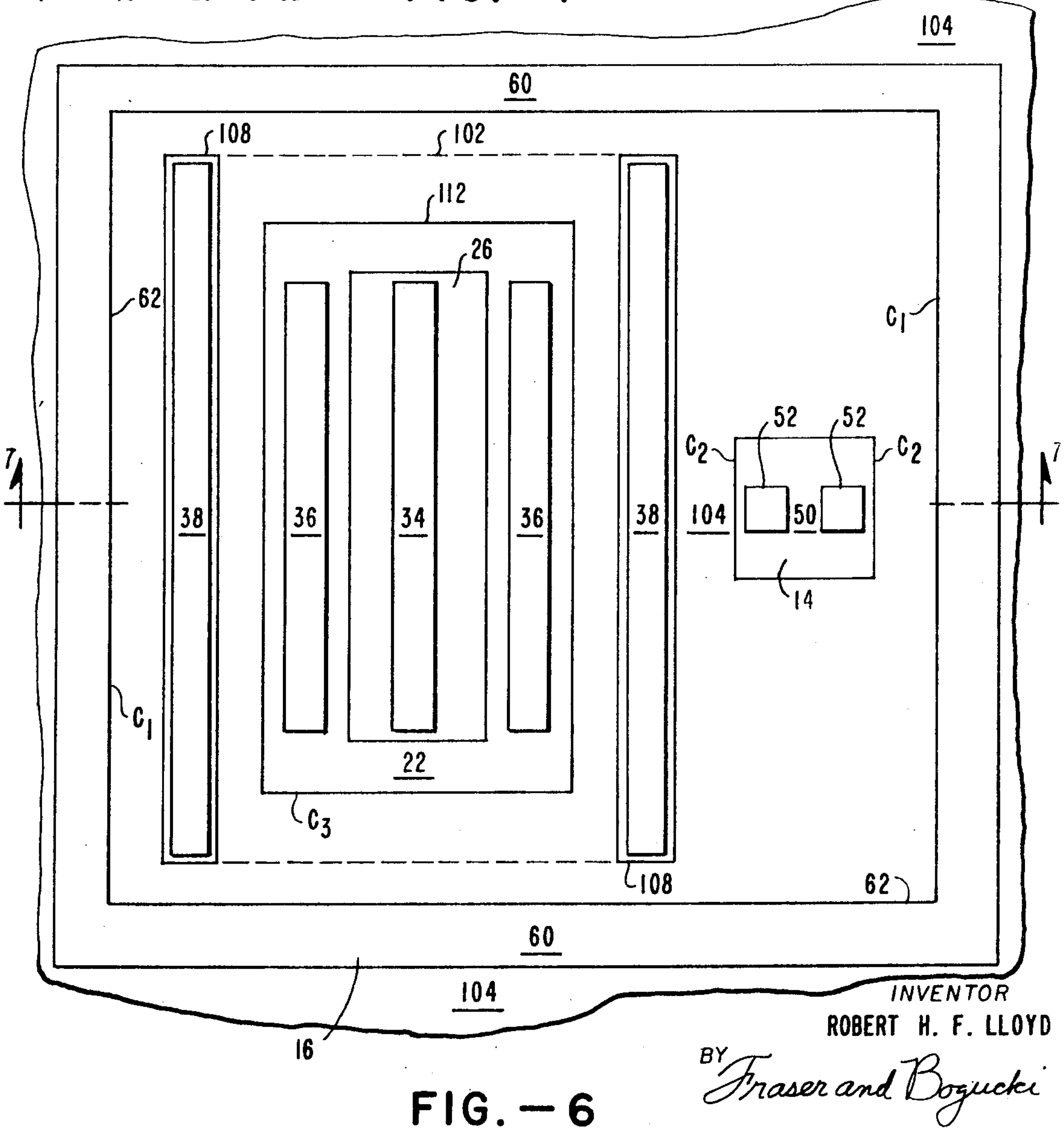
FIG. 6 is a plan view of an integrated circuit having an improved transistor in accordance with the invention.

In accordance with the present invention, the current gain bandwidth of the transistor 12 is preserved at high current densities without a sacrifice in performance due to increasing values of $C_1$, $C_2$, and $C_3$. As shown in FIGS. 6 and 7, one preferred embodiment of an improved transistor 100 in accordance with the invention assumes a configuration similar to that shown in the prior art structure of FIG. 1. During the manufacture of the integrated circuit 10, however, a buried layer 102 of relatively heavily doped material of N-type semiconductivity is formed at the interface between and is inset into the substrate 18 and collector 20 by considerable distances. The buried layer 102 defines a first portion of the collector region 20 of the transistor 100. A second portion 104 of the collector region 20 is defined by relatively lightly doped material of N-type semiconductivity formed by an appropriate process such as epitaxial growth so as to surround the buried layer 102 and extend over the remaining portions of the upper surface of the substrate 18. The relative thickness of the epitaxial layer 104 is greatly exaggerated in FIG. 7 for clarity of illustration. The base 22, emitter 24 and resistor 50 are inset into the epitaxial layer 104 from an upper surface 106 thereof in a manner similar to that shown in FIG. 1. In the arrangement of FIGS. 6 and 7, however, the base 22 is caused to extend into contact with the buried layer 102 to form the major portion of the collector-base junction 28. In the absence of the buried layer 102, the diffusion of the base 22 is often difficult because of the so-called "snow plow" effect in which the lower central portion of the base region extends downwardly to a greater extent than is desired to form a base region of undesired thickness. The presence of the buried layer 102 limits the downward diffusion of the base region, greatly facilitating the fabrication of bases of narrow width.

A pair of collector plugs 108 relatively heavily doped material of N-type semiconductivity are formed by a double diffusion so as to extend downwardly through the epitaxial layer 104 from portions of the upper surface 106 thereof spaced apart from the base and emitter 22, 24. The buried layer 102 extends beyond the base 22 in opposite directions so as to contact the collector plugs 108. The ohmic collector contacts 38 are formed with the collector plugs 108, and the plugs 108 together with the buried layer 102 define collector current paths of relatively high conductivity. The major portion of the collector-base junction 28 is formed by the junction between the buried layer 102 and the base 22. The remaining or sidewall portions of the collector-base junction are formed by the boundaries 112 between the sidewalls of the base 22 and the second collector portion or epitaxial layer 104.

Figure 8:
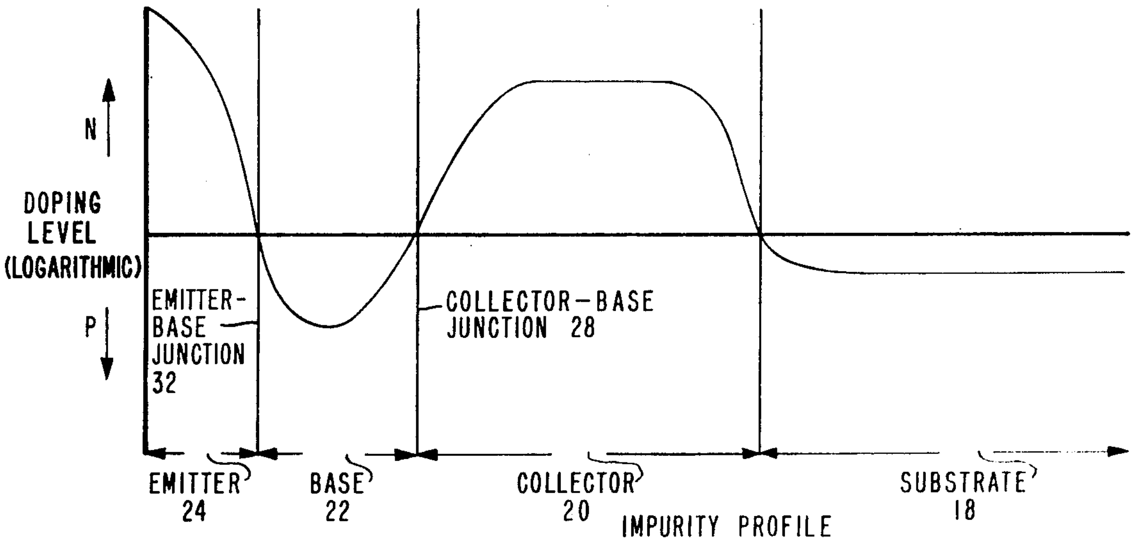
FIG. 8 is an impurity profile of the transistor in the FIGS. 6 and 7 arrangement.

As shown by the curve 120 of the transistor 100 impurity profile of FIG. 8, those portions of the buried layer 102 in the vicinity of the collector-base junction 28 provide a relatively high concentration of ionized impurity atoms. The extent of shifting of the depletion region 72 into the collector is accordingly limited and the transit time of minority carriers through the base 22 greatly shortened.

Figure 9:
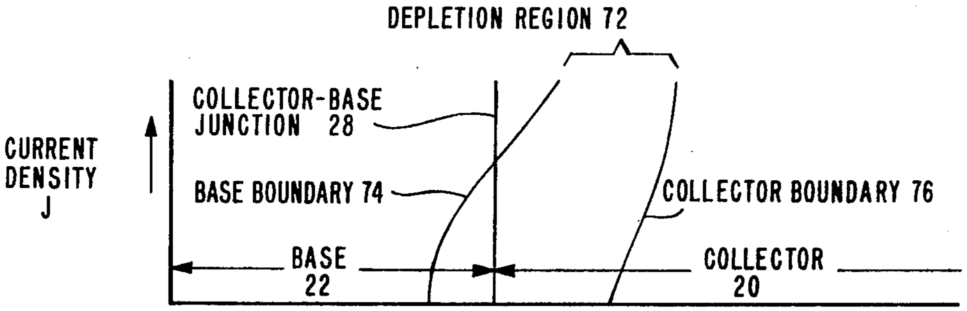
FIG. 9 is a diagrammatic plot of the collector-base depletion region boundaries of the transistor in the FIGS. 6 and 7 arrangement as a function of current density.

FIG. 9 illustrates the behavior of the collector-base depletion region 72 in the transistor 100 for various values of current density J, it being assumed that the buried layer 102 is formed by diffusion and that the impurity profile thereof approximates a gaussian function as shown in FIG. 8. The base boundary 74 shifts very gradually toward the collector-base junction 28 for increasing values of J and may eventually cross the junction as shown depending upon the transistor characteristics. The shift of the boundary 74 in the case of the transistor 100 is considerably less than in the case of the conventional transistor 12 as shown in FIG. 5 for equal values of current density J. The collector boundary 76 shifts into the collector region 20 at a diminishing rate as the current density J is increased. The depletion region 72 thus actually narrows as J is increased. The value of the capacitance $C_3$ at the junction of the base 22 and the buried layer 102 is increased only slightly by the presence of the buried layer since the impurity gradient of the buried layer is relatively small in the vicinity of this junction. That portion of the capacitance $C_3$ provided by the sidewall boundaries 112 is minimized by the presence of the lightly doped epitaxial layer 104. The net value of $C_3$ over the entire current density range is thus considerably lower than that for a transistor which has a uniformly highly doped collector region. By reducing the doping level of the collector region in the vicinity of the isolating region 60 and the resistor region 50, the effects of the sidewall capacitance $C_1$ and the resistor isolating junction capacitance $C_2$ are greatly reduced.

A number of additional advantages may be realized by the improved transistor 100 shown in the arrangement of FIGS. 6 and 7. Current mode logic gates for example frequently employ a plurality of input transistors. The collector-base junction capacitances $C_3$ of the undriven input transistors in such an arrangement act as speed degrading loads on the driven input transistors. If the input transistors assume the improved form shown in FIGS. 6 and 7 however, the effects of speed degradation are lessened since the undriven transistors have essentially no collector current and the capacitances which they present as loads are very small relative to their current handling capabilities.

In transistors having a relatively small emitter and a corresponding high emitter current density, a large portion of the total bulk collector resistance is comprised of the resistance of that portion of the collector region in the vicinity of the collector-base junction. In the improved transistor 100 the buried layer 102 extends into contact with the base 22, and accordingly greatly minimizes the bulk collector resistance. As the collector boundary 76 of the depletion region 72 undergoes a slight shift into the collector region in response to high current densities, a region of relatively high impurity doping is reached, and the diffusion voltage of the collector-base junction 28 is increased. The increased diffusion voltage reduces the tendency of the transistor 100 to saturate at high current densities, since a greater bias of the collector-base junction 28 is required in order to produce minority carrier injection.

While the invention has been particularly shown and described with reference to a preferred embodiment thereof, it will be understood by those skilled in the art that various changes in form and detail may be made therein without departing from the spirit and scope of the invention.

What is claimed is:

1. An integrated circuit comprising a substrate element of a first type of semiconductive material having a surface; a collector element of a second type of semiconductive material opposite the first type disposed on said surface of the substrate element and having a surface opposite the substrate element, a buried layer of the second type of semiconductive material disposed opposite said opposite surface and partially inset in the substrate element at said surface thereof, and at least one collector plug of the second type of semiconductive material extending between the buried layer and said opposite surface; a base element of the first type of semiconductive material having a surface substantially continuous with said opposite surface of the collector element and disposed within the collector element and in contact with the buried layer to form a collector-base junction; an emitter element of the second type of semiconductive material having a surface substantially continuous with said continuous surface of the base element and disposed within the base element to form an emitter-base junction; an emitter contact mounted on said continuous surface of the emitter element; a base contact mounted on said continuous surface of the base element; a collector contact mounted on the at least one collector plug at said opposite surface of the collector element, said buried layer and collector plug being degenerately doped with impurities and said collector element being intrinsically doped with impurities.

2. An integrated circuit in accordance with claim 1, further including a resistor element of the first type of semiconductive material having a surface substantially continuous with said opposite surface of the collector element and disposed within the collector element at said opposite surface thereof.

3. An integrated circuit in accordance with claim 1, further including at least one isolation element of the first type of semiconductive material having a surface substantially continuous with said opposite surface of the collector element and extending through the collector element and into contact with the substrate element.

4. An integrated circuit comprising a unitary body with a bulk semiconductor material of a first type of semiconductivity forming a substrate region, a region of a second type of semiconductivity partially inset within the substrate region and from a surface thereof and forming a buried layer, an epitaxial layer of material of the second type of semiconductivity extending over said surface of the substrate region and a portion of the buried layer, said epitaxial layer having a surface opposite the substrate region which defines the upper surface of the integrated circuit, said epitaxial layer and said buried layer together forming a collector region, a base region of material of the first type of semiconductivity inset from said upper surface of the epitaxial layer and extending into contact with the buried layer to form the major portion of a collector-base junction, and an emitter region of the second type of semiconductivity inset from a surface of the base region opposite the buried layer and forming an emitter-base junction with the base region.

5. An integrated circuit in accordance with claim 4, further including at least one region of the second type of semiconductivity inset from said upper surface of the epitaxial layer and extending into contact with the buried layer to form a collector plug, said collector plug having a relatively high impurity doping level to define a collector current path of relatively high conductivity between said upper surface of the epitaxial layer and the buried layer, an emitter contact formed with said emitter region, a base contact formed with said base region, and a collector contact formed with said collector plug.

6. An integrated circuit in accordance with claim 5, wherein said epitaxial layer has a relatively low impurity doping level to minimize the effects of capacitance at the boundary between the epitaxial layer and the base region which is inset therein.

7. An integrated circuit in accordance with claim 6, further including at least one isolation region of the first type of semiconductivity inset from a portion of the upper surface of the epitaxial layer spaced apart from said emitter and base regions and extending into contact with said substrate region, said isolation region in combination with adjacent portions of the epitaxial layer providing resistive isolation of the transistor defined by said emitter, base and collector regions, and wherein the relatively low impurity doping level of the epitaxial layer minimizes the effects of capacitance at the boundary between the epitaxial layer and the isolation region.

* * * * *